United States Patent [19]

Swerdlow

[11] 4,019,140
[45] Apr. 19, 1977

[54] METHODS AND APPARATUS FOR REDUCING INTELLIGIBLE CROSSTALK IN SINGLE SIDEBAND RADIO SYSTEMS

[75] Inventor: Richard Barry Swerdlow, Haverhill, Mass.

[73] Assignee: Bell Telephone Laboratories, Incorporated, Murray Hill, N.J.

[22] Filed: Oct. 24, 1975

[21] Appl. No.: 625,491

[52] U.S. Cl. .................................. 325/65; 325/131
[51] Int. Cl.² .................... H03B 23/00; H04B 1/62
[58] Field of Search ............... 325/32, 34, 35, 42, 325/45, 46, 49, 50, 61, 65, 131, 39, 40

[56] References Cited

UNITED STATES PATENTS

| | | | |
|---|---|---|---|
| 2,448,055 | 8/1948 | Silver et al. | 325/33 |
| 2,692,330 | 10/1954 | Kahn | 325/65 X |
| 3,100,871 | 8/1963 | Richardson et al. | 325/50 X |
| 3,140,490 | 7/1964 | Sichak et al. | 343/100 R |
| 3,343,087 | 9/1967 | Helms | 325/42 |
| 3,354,410 | 11/1967 | Beuscher | 325/65 X |
| 3,371,277 | 2/1968 | Scantlin | 325/42 |
| 3,478,268 | 11/1969 | Coviello | 325/65 |
| 3,562,420 | 2/1971 | Thompson | 325/65 X |
| 3,614,622 | 10/1971 | Holsinger | 325/65 X |
| 3,689,841 | 9/1972 | Bello et al. | 325/50 X |

OTHER PUBLICATIONS

Proceedings of the IEEE, May 1973, "Spread Spectrum as a Multiplexing Technique", Breynard and Dobson, pp. 113–120.

*Primary Examiner*—Benedict V. Safourek
*Attorney, Agent, or Firm*—Bryan W. Sheffield

[57] ABSTRACT

Intelligible crosstalk in microwave radio systems employing single-sideband modulation is substantially eliminated by phase-modulating the AM carrier-wave prior to its modulation by the baseband signal. The phase-modulation may comprise a periodic signal, such as a single sinusoidal tone or pseudo-random noise, or it may comprise an aperiodic signal such as a truly random noise. In this latter event, the coding signal is transmitted to the receiving location to ensure proper demodulation of the encoded signal.

46 Claims, 9 Drawing Figures (a) SPECTRUM OF $\cos[\omega_0 t + f(t)]$ (EXAGGERATED)

(b) SPECTRUM OF W(t) (SIMPLE EXAMPLE)

(c) SPECTRUM OF U(t)

(d) SPECTRUM OF X(t)

METHODS AND APPARATUS FOR REDUCING INTELLIGIBLE CROSSTALK IN SINGLE SIDEBAND RADIO SYSTEMS

BACKGROUND OF THE INVENTION a. Field of the Invention

Broadly speaking, this invention relates to radio transmission. More particularly, in a preferred embodiment, this invention relates to methods and apparatus for eliminating crosstalk in radio systems of the type that employ single-sideband modulation.

b. Discussion of the Prior Art

As is well known, a considerable portion of the Nation's long-haul telecommunications traffic is carried over a coast-to-coast network of high-capacity microwave radio systems. This network is characterized by a large number of junctions or towers where two or more different routes cross. Foreground reflections generally limit antenna discrimination on such crossing routes to less than 70 dB which leads to interference between routes using the same channel assignments. This type of interference is called co-channel interference because the interfering signal occupies the same frequency spectrum as does the desired signal. There are, of course, other mechanisms producing co-channel interference but the effect is the same.

Heretofore, co-channel interference has not been particularly annoying to the average subscriber because virtually all of these microwave systems employ frequency modulation and frequency modulation exhibits substantial resistance to this type of interference, due to the high modulation index placed on an FM signal.

More specifically, in an FM system the high index components, generally called "burble", are located well below the message band and their effect is to spread or smear the message load in the frequency domain. Thus, if an interfacing, co-channel signal enters an FM receiver where either the interference and/or the desired signal are burbled, the interference remains smeared but the desired signal is properly demodulated. The smearing of an FM signal has two basic effects; first, it reduces the amplitude of the signal in each interfering voice circuit; and second, it mixes several interfering circuits so that they appear together at one desired location in the receiver. The net result is that, on the average, the interference power into a desired circuit is the same as without burble but the noise is now close to thermal in nature and consequently, much less annoying.

Although frequency modulation systems are widespread and highly successful, the ever-increasing demand for higher system capacity, together with a shortage of available frequencies in the microwave spectrum, has led to a search for a more efficient modulation scheme. This search has concentrated on single-sideband modulation (SSB), a well-known technique wherein the carrier frequency and one of the two AM sidebands centered about the carrier frequency are suppressed prior to transmission. Unfortunately, with the use of SSB modulation co-channel interference can no longer be so easily dismissed. This is due to the high frequency stability inherent in single-sideband modulation. This high degree of stability causes an interfering SSB channel to produce intelligible crosstalk in the interfered-with system, and this crosstalk is subjectively far more disturbing to a subscriber than thermal noise would be.

A slight misalignment of the carrier frequencies used to generate the baseband voice channels, for example by a few hundred Hz, might conceivably be used to render the voice interference unintelligible and so less annoying, but tone interference, for example, from multifrequency operator or customer dialing tones, or from supervisory signals transmitted on the voice channels, would remain a problem.

SUMMARY OF THE INVENTION

What is needed, then, is a technique for coding an SSB signal in such a way that an interfering signal may be distinguished from the desired signal, thus permitting the interfering signal to be suppressed. I have discovered that low-frequency phase-modulation may be employed to perform the desired coding of the single-sideband signal. This low-frequency modulation is advantageously applied to the SSB carrier wave at the transmitter, prior to its modulation by the baseband signal. The signal employed to generate the phase-modulation may be periodic, for example, a sinusoidal wave or pseudo-random noise, or aperiodic, for example, a truly random noise. In the latter case, the random code which is used to encode the SSB signal must be transmitted to the receiving location, along with the phase-modulated SSB signal, to ensure proper demodulation.

The invention and its mode of operation will be more fully understood from the following detailed description, when taken with the appended drawings in which:

DETAILED DESCRIPTION OF THE INVENTION

Figure 1:
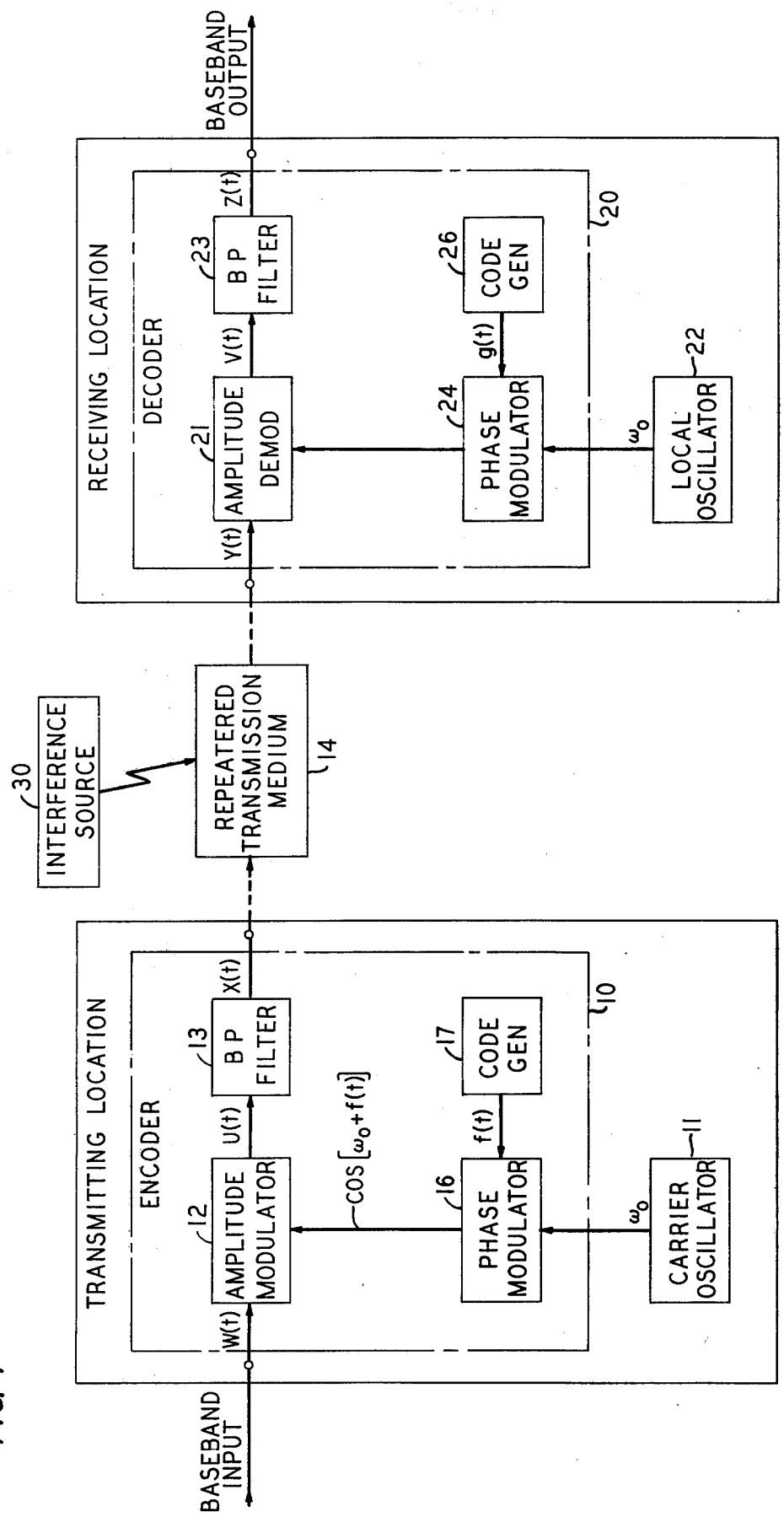
FIG. 1 is a block schematic diagram of an illustrative radio transmission system employing coded phase-modulation according to the invention.

FIG. 1 depicts an illustrative radio transmission system according to the invention. As shown, the system includes an encoder 10, illustratively located at the transmitting terminal of the system, and a decoder 20 correspondingly located at the receiving terminal. Coder 10 includes a carrier oscillator 11 which applies a carrier wave to the input of an amplitude modulator 12, the output of which is connected to a bandpass filter 13, thence to a repeatered transmission medium shown schematically as element 14. A phase-modulator 16 is interposed between the output of carrier oscillator 11 and the input to modulator 12. A code generator 17 is connected to the input of phase-modulator 16 to control the nature of the phase-modulation which is impressed on the output of oscillator 11.

The decoder 20 includes an amplitude demodulator 21 which, in addition to the signal from repeatered transmission medium 14, also receives the output of a local oscillator 22. The output of demodulator 21 is passed through a bandpass filter 23, the filtered output of which comprises the output of the decoder. A phase-modulator 24 is interposed between the output of local oscillator 22 and the input to demodulator 21. A code generator 26 is connected to the input of phase-modulator 24 to control the nature of the phase-modulation which is impressed on the output of oscillator 22. One skilled in the art will appreciate that except for circuit elements 16, 17, 24 and 26, the configuration shown in FIG. 1 is a conventional SSB radio system.

The input to modulator 12, designated as $w(t)$, is the baseband signal to be transmitted to the distant end of the system. This baseband signal may be a single voice channel or a single sinusoidal tone, but more typically comprises a mastergroup, or combination of mastergroups, of a communications multiplex system.

The output of oscillator 11, i.e., the carrier which is amplitude-modulated in modulator 12, has a frequency which is designated $\omega_o$. As will be more fully explained below, phase-modulator 16 modulates the phase of the output signal from oscillator 11 with the output of code generator 17, which output is designated as $f(t)$. For the purpose of the following discussion, $f(t)$ is considered periodic although, as will be explained later, $f(t)$ may also be aperiodic. In the illustrative microwave radio system shown $\omega_o$ is a carrier in the IF frequency range, typically 74 MHz. $x(t)$, the output of filter 13, will then be a single sideband signal in the 55–85 MHz band. This SSB signal is then heterodyned in the normal manner up to the 4–6 GHz common carrier microwave band for transmission over the repeatered transmission medium. To avoid complicating the drawing, the RF upconverter at the transmitting location and the corresponding downconverter at the receiving location have been omitted from the drawing. The form of $f(t)$ can range from a pure sinusoid to a noiselike signal.

The output of modulator 12, designated $u(t)$, comprises the carrier $\omega_o$ and the upper and lower AM sidebands generated by modulator 12. Filter 13 is selected so that it removes the carrier frequency $\omega_o$ and one of the sidebands generated by modulator 12 and, thus, generates $x(t)$ the desired SSB signal.

More specifically, the output of encoder 10, $x(t)$, comprises a single sideband signal having a bandwidth which is slightly expanded with respect to the bandwidth of the baseband signal, $w(t)$. The reason for this expansion is the phase-modulation of the carrier introduced by phase-modulator 16. The spectrum of $x(t)$ is the convolution of the spectrum of $w(t)$ with the spectrum of $\cos[\omega_o t + f(t)]$, the output of modulator 16. The spectrum of this latter signal depends on the index of modulation and the highest frequency of $f(t)$. This relationship may be more clearly seen in FIG. 2 where graph (a) represents the spectrum of the convoluted signal $\cos[\omega_o t + f(t)]$, that is, the output of phase-modulator 16; graph (b) represents the spectrum of the baseband signal, $w(t)$, for a relatively simple case; graph (c) represents the spectrum of $u(t)$, that is, the output of modulator 12; and graph (d) represents the spectrum of the signal $x(t)$, that is, the output of filter 13 after the carrier and lower sideband have been suppressed.

The coded signal is now transmitted over the repeatered transmission medium 14 in the conventional manner. Typically, transmission medium 14 will comprise several microwave repeater stations, the free space between the towers and the terminal equipment involved in amplifying and filtering the signal. Transmission medium 14 is assumed linear but may include components tending to produce spurious signals of low amplitude, due to non-linear circuit elements in the medium.

The output of the repeatered transmission medium designated as $y(t)$, is applied to the input of AM demodulator 21. By analogy to the output of modulator 16 in coder 10, the output of phase-modulator 24, that is the demodulating signal for decoder 20, is given by the expression $\cos[\omega_o t + g(t)]$. It will now be shown that proper decoding of $w(t)$ of the baseband signal will only occur when $g(t)$ equals $f(t)$. Thus, for the case illustrated in FIG. 2 where the baseband signal comprises a simple sinusoid, e.g., where $w(t) = \cos \omega_s t$:

$$u(t) = \cos \omega_s t \cos[\omega_o t + f(t)] \quad (1)$$

$$= \tfrac{1}{2}\cos[(\omega_o+\omega_s)t+f(t)] + \tfrac{1}{2}\cos[(\omega_o-\omega_s)t+f(t)]. \quad (2)$$

Figure 2:
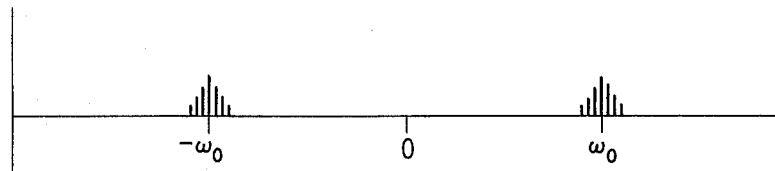
FIG. 2 is a diagram which illustrates various frequency spectra generated by the circuit of FIG. 1.
Figure 2:
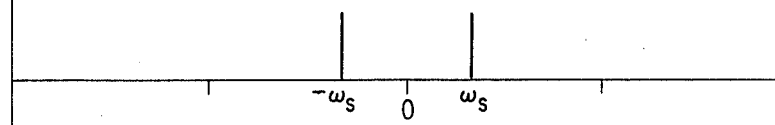
Figure 2:
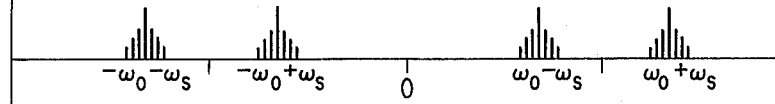
Figure 2:
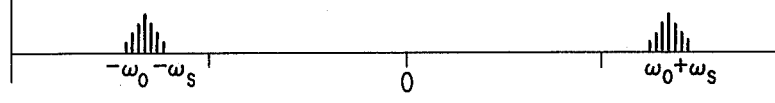

As previously discussed, the spectrum of $u(t)$ is represented by waveform (c) in FIG. 2. Mathematically speaking, the spectrum of $\cos[\omega_o t + f(t)]$ extends to infinity on both sides so that, in theory, each sideband of $u(t)$ overlaps the other. However, the spectral energy decreases so rapidly that deleting one of the cosine terms in the mathematical expression is essentially the same as dropping a sideband, for example, by filtering the signal in a bandpass filter. For example, if we assume that $f(t)$, the input to phase modulator 16 in FIG. 1, is of the form $f(t) = X \cos \omega_c t$, then it can be shown that the convoluted output of modulator 12 will be given by the well-known expression:

$$\cos(\omega_o t + X\cos\omega_c t) = \sum_{n=-\infty}^{\infty} J_n(X)\cos\left(\omega_o t + n\omega_c t + \frac{n\pi}{2}\right) \quad (3)$$

wherein $J_n(X)$ is the Bessel function of order $n$ and argument $X$. From the above it can be seen that the power in any sideband is:

$$|J_n(X)|^2/2. \quad (4)$$

The ratio of the power in any sideband to that of the unmodulated carrier, expressed in decibels, is:

$$20 \log |J_n(X)|. \quad (5)$$

Figure 3:
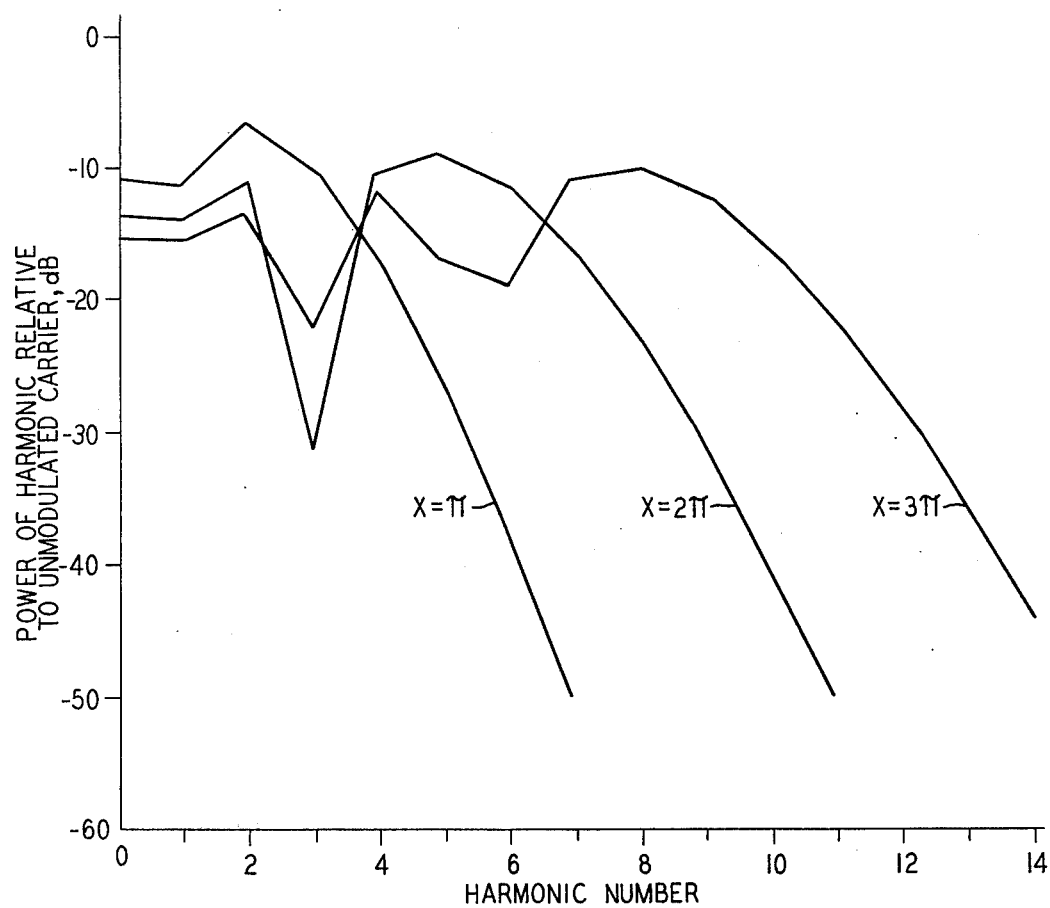
FIG. 3 is a graph showing how the harmonic power in a signal coded by the apparatus shown in FIG. 1 varies with the modulation index used to generate the same.

This is shown in FIG. 3 where the above power ratio is plotted on the ordinate against $n$, the harmonic number for several different values of X. Even though only values at integer values of $n$ are defined, the points have been joined for convenience. Any particular curve was ended when either the next value was below −60 dB or beyond the fourteenth harmonic. As a rule of thumb, the bulk of the spectral power is contained in a frequency range $X\omega_c$. There is no sensible power beyond the sixteenth harmonic of $f(t)$. For example, if the baseband signal to be coded had a lower cut-off frequency of 564 kHz, the upper bound on the coding frequency would be 34 kHz for an index of $3\pi$ since the sixteenth harmonic of 35 kHz is 560 kHz. In practice, this bound might have to be reduced still further to protect any pilot frequencies that might fall between mastergroups. Since the spectral energy decreases so rapidly, deleting one of the cosine terms is essentially the same as dropping a sideband. Thus, after filtering in bandpass filter 13, $$x(t) = \tfrac{1}{2} \cos[(\omega_o + \omega_s)t + f(t)] \qquad (6)$$

which is the coded signal to be sent to the demodulator at the far end of the system.

Assuming for the moment that $y(t)$, the output of repeatered transmission medium 14 is identical to $x(t)$, then the output of demodulator 21, designated as $v(t)$, will be given by the equation:

$$v(t) = \tfrac{1}{2}\cos[(\omega_o + \omega_s)t + f(t)] \cos[\omega_o t + g(t)] \qquad (7)$$

$$= \tfrac{1}{4}\cos[(2\omega_o + \omega_s)t + f(t) + g(t)] + \tfrac{1}{4}\cos[\omega_s t + f(t) - g(t)] \qquad (8)$$

The same condition that permitted us to derive equation (6) from (2) now yields, for $f(t) = g(t)$:

$$z(t) = \tfrac{1}{4} \cos \omega_s t \qquad (9)$$

as the output of decoder 20, which is identical with the baseband input to the distant encoder, but reduced in amplitude.

The system discussed above with reference to FIG. 1 is linear time varying so the above analysis will hold for any baseband signal, $w(t)$, which may be expanded by means of a Fourier series. In fact, the result may also be extended to stochastic or aperiodic signals.

The operation of encoder 10 may be viewed as AM modulation with a local oscillator which has a great deal of phase noise, except that the noise is accurately known and well controlled. The decoder 20 behaves like a phase-locked loop which follows the noisy carrier, except that it has available to it an exact replica of the noise.

As previously discussed, it is important that all system control signals, such as pilot tones, be placed on the channel after coding to prevent their being spread by the encoding process. The composite signal will then be operated on by any repeater equalization and linearization contained in the transmission medium 14 in the same manner as if no coding were present. The only constraint is that control tones be far enough away from the signal to avoid the dispersed spectrum. Since dispersion will generally be less than 60 kHz and control signals can be placed in slots 100 kHz or more wide, this proves to be no problem in practice.

Figure 4:
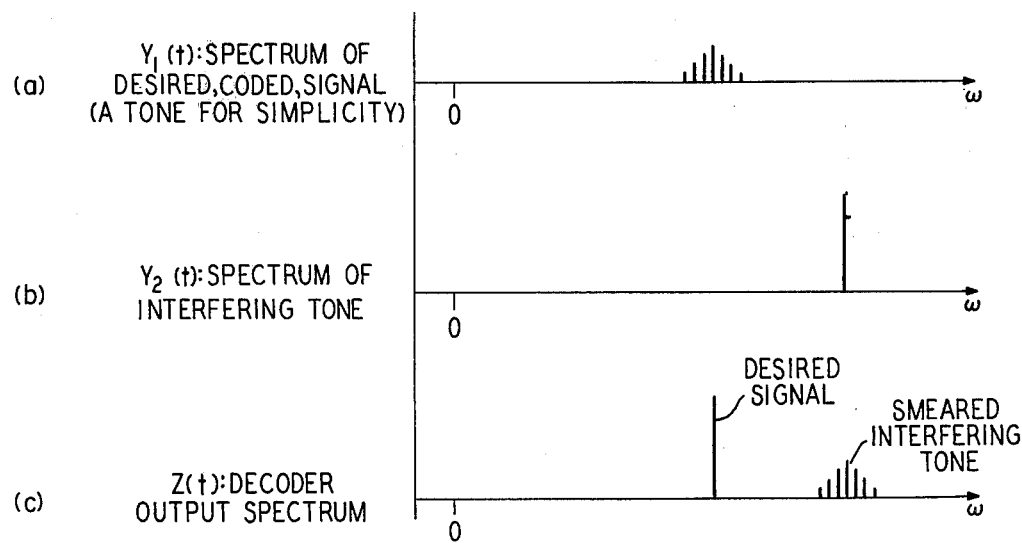
FIG. 4 is a diagram which illustrates how the apparatus shown in FIG. 1 acts to render interference crosstalk unintelligible.

With reference to FIG. 4, let us now consider the effect of a co-channel interfering signal, for example, from some undefined interference source 30 which injects an RF signal somewhere along the repeatered transmission medium 14, or at the input to decoder 20. The input to the decoder now comprises two signals, $Y_1(t)$ and $Y_2(t)$, where $Y_2(t)$ represents the interfering signal which, for the moment, is assumed to have no coding.

Since the operation of decoder 20 is linear, superposition can be applied so that the response to the combined signal $Y_1(t) + Y_2(t)$ is the sum of the separate response to each component signal. The desired signal $Y_1(t)$, will be decoded in the normal manner but the interfering signal will, in effect, be coded by the decoder. Its spectrum at the decoder output will therefore be convolved with the spectrum of $\cos[\omega_o t + f(t)]$ and will produce in the decoder output, $z(t)$, essentially the same effect as does burble in an FM system. That is, each interfering voice circuit will be attenuated and several different voice circuits will be mixed together. In FIG. 4, graph (a) represents the positive frequency spectrum of $Y_1(t)$, the signal corresponding to the baseband signal $w(t)$, here, for simplicity, considered to be a pure sinusoidal tone. Graph (b) of FIG. 4 represents the spectrum of the interfering tone, $Y_2(t)$, again considered for simplicity to be a simple sinusoidal tone. Graph (c) represents the linear superposition of these two signals at the output of filter 23 and it is evident from the drawing that in the real situation, where $w(t)$ is more complex, the interfering tone will be smeared so that it will be audible, if at all, with reduced amplitude over one or more voice channels in the mastergroup comprising $w(t)$.

This raises the question of how we select the coding function. The two most important considerations are the effectiveness of the code, that is, the subjective effect on the subscriber, and its ease of implementation. Included in the ease of implementation is controlling the impairments that accompany imperfect decoding.

As far as the subjective improvements are concerned, the interference power with or without coding is the same. For the FM case, where the burble (i.e., code) is truly random, the annoyance is significantly less than for unburbled interference. For example, a proposed CCITT requirement on the tone interference level allowable in a 40 dBrncO circuit is −68 dBmO. By way of contrast, the same circuit is allowed up to −48 dBmO of thermal noise. Since burble renders a tone noise-like, it is clear that a 20 dB reduction in subscriber annoyance from tones is possible with FM coding. Since coding of a single sideband signal produces essentially the same effect on the interference as does burble on an FM system, there is little question that the coding techniques of the instant invention represent a significant improvement over conventional AM systems. For example, recent experiments have shown that code indices of 1.5 radians are sufficient to render speech unintelligible and almost 6 dB less annoying than other forms of unintelligible speech found on the telephone system, with the spectral spreading contained within a voice circuit. The question is, how elaborate must the coding signal be? Certainly, a random code, or a pseudo-random code with a thirty second period, will duplicate the FM effect. However, a single-tone code is considerably simpler to implement. Of course, the embodiments of the invention which permit the use of a random code require somewhat more elaborate decoding equipment than is the case for periodic codes.

Codes with large peak frequency deviations spread interference power from a specific interferer over several circuits, thus achieving a power reduction of that particular interferer in a circuit. This helps in reducing all forms of interference, such as intelligible crosstalk, babble, tones, and echo. The penalty paid for this particular effect here is that, as will be described below, imperfect decoding leaves residuals in these voice circuits which themselves produce annoyance.

Another considersation in code selection is administration. In a 4000-mile connection we might have perhaps 100–300 interferences. To be sure of the subjective advantages in all cases, each channel known to interfere would have to have a separate code. Barring this, we would have to have some large number of possibilities, say 20 codes to protect us over a terminal section. In addition, for schemes which require the code to be known at the receiver, a craftsperson would have to set the appropriate code.

In the following, we discuss three types of codes: tone codes, pseudo-random codes, and purely random codes. Tone codes are easy to implement, but their subjective effects are not as effective in reducing annoyance as pseudo-random or random codes. Decoders can be built for tone codes that are self-identifying, that is, the craftsperson need not set the tone code at the receiver. The number of acceptable tone codes is limited to perhaps ten. For pseudo-random codes, the subjective effects are as good as for random codes, which are the best from this standpoint, but require setting the code at the receiver for best results. There should be little difficulty in achieving several tens of pseudo-random codes. For the random code, the subjective effects are best, and there is no administrative problem since all codes are different. The problem here is that the decoder must reproduce the code, which requires generally a high signal-to-noise on the pilot sending the code.

There are two types of decoders that will be discussed. The one, used as example so far, is where the code is available at both transmit and receive ends. In this case, only a synchronization signal need be sent. This synchronization signal would need roughly the same signal-to-noise as pilots used for carrier regeneration. The second type of decoder is one which detects the code that was sent and uses it to decode the signal. One way to accomplish this at the receiver is to use a phase-locked loop on a pilot that has been coded. The signal-to-noise required for such a pilot, however, is far larger than that for the first receiver, because additive system noise present near the pilot will be transferred by the loop onto the load. This second type of receiver, however, must be used for random codes. Either receiver may be used for the tone or pseudo-random codes.

Figure 5:
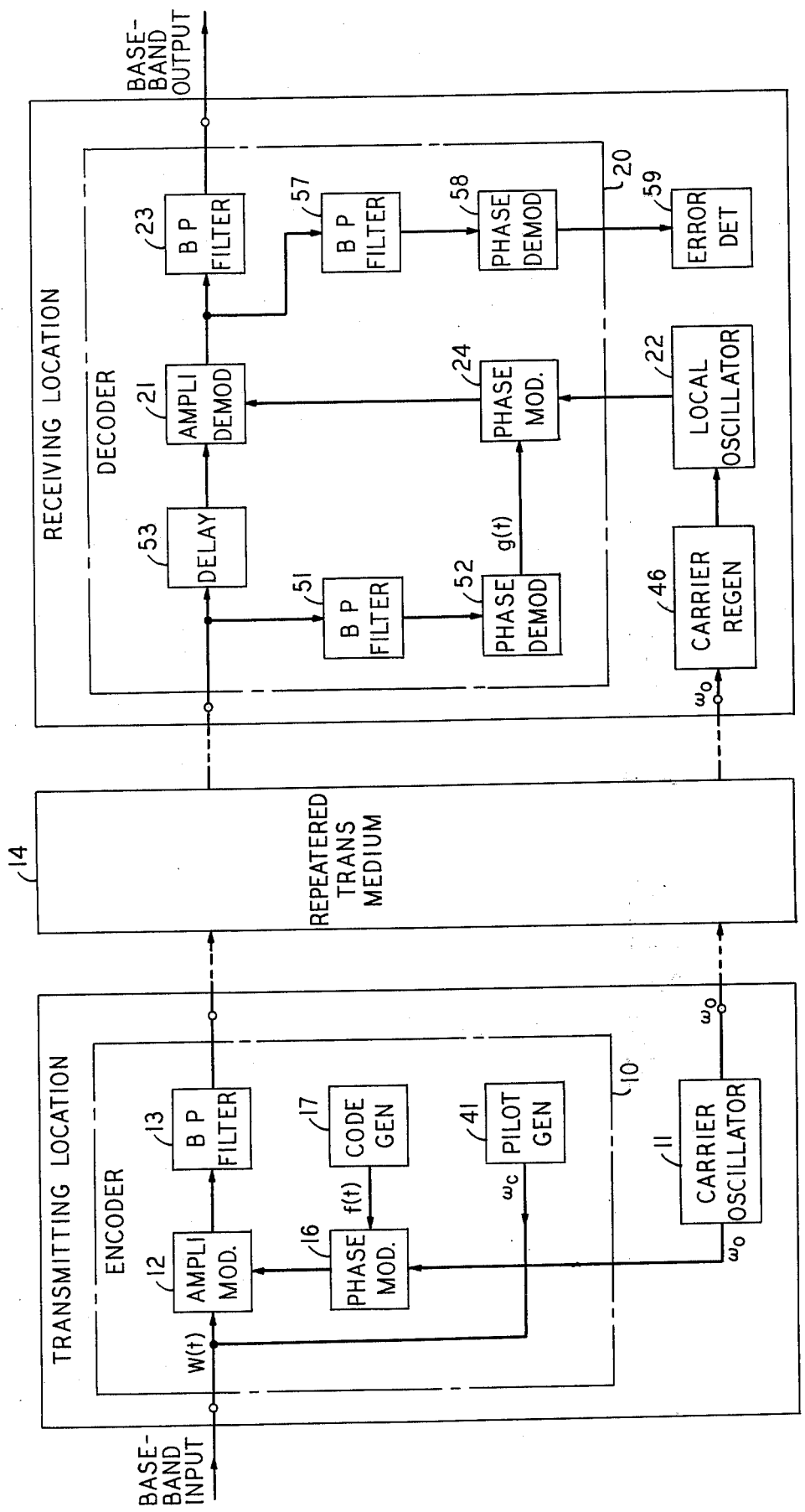
FIG. 5 is a block schematic diagram of a second illustrative embodiment of the invention wherein a coding pilot tone is added to the message signal, prior to amplitude modulation thereof.

We can consider specific instances of the above considerations in the format of the situation in FIG. 5. In general, we have a set of codes, $f$, whether random or not. If $Y_1(t)$ were coded with $f_k(t)$ and $Y_2(t)$ with $f_l(t)$, the decoded version of the interference at decoder 20 is $$z(t) = \tfrac{1}{4} \cos[\omega_s t + f_k(t) - f_l(t)] \tag{10}$$

Suppose $f_k$ and $f_l$ are both sinusoids. Now, it may be shown that $$\cos(X\cos x) = Re\left[\sum_{n=-\infty}^{\infty} J_n(X) e^{j\left(n\alpha + \frac{n\pi}{2}\right)}\right] \tag{11}$$

and also that $$J_{-n}(X) = (-1)^n J_n(X), \tag{12}$$

which relationships may be inferred from the series for $J_n(X)$. It follows then that $$\cos[\omega_s t X(\cos k\omega_c t - \cos l\omega_c t)] =$$

$$Re\left\{\sum_{n=-\infty}^{\infty}\sum_{m=-\infty}^{\infty} (-1)^m J_n(X) J_m(X) \cdot e^{j\left[\omega_s t + (nk + ml)\omega_c t + (n+m)\frac{\pi}{2}\right]}\right\} \tag{13}$$

From the above expression it will be seen that the amplitude of the spectrum depends only on the index of modulation and that the locations of the lines in the spectrum are harmonics of $\omega_c$, just as the various codes themselves are. With this scheme, i.e., where a pilot tone $\omega_c$ is used to snychronize the code generator in the encoder and this pilot tone is transmitted to the decoder, it is necessary to employ automatic gain control on the coding tone at the decoder to ensure that the index of modulation employed at the decoder is the same as that which was sent from the encoder. As a simple estimate, a value of $j = 1$ was considered for the decoder with no code on the interference, that is $i = 0$. For values of index of modulation between 2 and 3, all coefficients are down by 8 dB or more (see FIG. 3). A single interfering tone would then be present at perhaps ten harmonic locations, each suppressed by 8 dB or more.

Some consideration must be given to the choice of the pilot frequency, $\omega_c$. This frequency must be greater than several hundred Hz if the intelligibility of the crosstalk is to be suppressed, but if it is made too small, several harmonics of $\omega_c$ will lie in a voice circuit and thereby raise the total interference power from one source. Ideally, only one harmonic per voice circuit should be present and this suggests a coding frequency of about 2 kHz, which is at least several hundred Hz from the nearest tone frequency customarily employed on voice circuits for supervision purposes. On the other hand, $\omega_c$ may be increased until the dispersing spectrum becomes too large to meet minimal error on decoding. Five distinct codes, i.e., five distinct pilot frequencies, would give ten distinct pairs of frequencies when two separate routes are considered, thus permitting administration of even the largest junction of microwave routes found within the industry. Somewhat more codes might be necessary to protect an entire terminal section of 10 to 15 repeaters.

A particularly attractive feature of a single-frequency code is its self-identification. All code frequencies could be designed to fit within the capture range of the synchronization circuitry associated with the decoder, but once lock is established, the decoder has both the code and its synchronization. Thus, no code selection is needed at the receiver which makes administration of the overall coding system considerably easier to implement. This is essentially the second type of receiver discussed above.

Ideally, a receiver which employs a code differing from the code of an interfering signal should produce a flat spectrum which is down always by the same amount and over the same bandwidth for any tone in the interfering signal. One way to closely approach the ideal flat spectrum mentioned above, but retaining the convenience of periodicity, is to use pseudo-random noise as the encoding signal. As is well known, this type of signal may be generated by filtering a broadband binary signal which is generated by conventional digital techniques. A counter operating at a clock rate of from ten to twenty times that of the desired noise cut-off frequency, as calculated below to achieve a given degree of crosstalk suppression, will generate a binary sequence with a period in the millisecond range which sequence is then filtered to the proper bandwidth. The resultant signal is close to Gaussian statistics (over a period) but is periodic at the counter period. This signal becomes the coding signal, $f(t)$, which is then used to phase-modulate the carrier frequency $\omega_0$. With this technique, a sufficiently high index of modulation is used to place almost all of the power into the first order sidebands. To an accuracy which is sufficient here, carrier power is reduced by $e^{-D_\phi}$ where $D_\phi$ is the mean square phase deviation of the coding signal in square radians. Furthermore, since the first order sidebands are essentially flat, the attenuation of an interfering 3 kHz voice circuit is:

$$A_s \cong -10 \log \frac{2f_t}{3 \times 10^3} \qquad (14)$$

where $A_s$ is the spectral power per 3 kHz slot below unmodulated carrier, in dB $f_t$ is the baseband noise cut-off frequency, in Hz.

Thus, a 15 kHz noise bandwidth assures a flat 10 dB suppression and a mean square phase deviation of 2.3 suppresses the carrier by 10 dB. The second order sidebands are important, giving a total dispersion bandwidth of about 60 kHz. Again, an automatic gain circuit is necessary at the decoder to accurately control the modulation index.

To write the set of coding functions more properly, denote the value of the binary sequence $f_k$ at transition times to be $f_{kn}$, that is:

$$f_K(nt_o) = f_{kn}; f_{kn} = 1 \text{ or } 0 \text{ only}, \qquad (15)$$

where $t_o$ is the transition time of the binary source. Assume further that all filters used in the circuit have an impulse response $h(t)$. As previously mentioned, this filtering action is what produces the cut-off $f_t$, then:

$$f_k(t) = \sum_{n=-N}^{N} f_{kn} h(t-nt_o) \qquad (16)$$

where $nt_o = T$, the period of the source. As previously, the spreading factor upon decoding is given by the equation:

$$\cos \left[ \omega_s t + \sum_n (f_{kn} - f_{ln}) h(t - nt_o) \right] \qquad (17)$$

and whereas $f_{kn}$ is either 0 or 1, $(f_{kn} - f_{ln})$ may be 0, 1, or −1. So, although the decoded spectrum for an interference signal will differ from the coded spectrum, it is not an easy matter to analytically calculate the spectrum of the interference signal without the assistance of a computer where the actual $f$ sequence as generated by a counter with different tap connections may be used.

Provided that the decoded spectrum for an interference signal is similar for all possible codes, uniform suppression and spreading of the interfering signal is possible for all codes. Under the circumstances, code generation is fairly simple; the same synchronizing frequency is used for all codes but the sequence is changed. This amounts to changing the switch settings on the binary counter used to generate the pseudo-random noise and several tens of separate codes are easily obtainable, for example, with TTL logic. Of course, the second type of decoder mentioned above and discussed more thoroughly below, could be used.

Although it is easier to implement the encoding of a baseband signal with a single-tone, rather than with pseudo-random noise, the noise-like signal has the advantage of uniformity of action on interference over a large number of codes. Both the single-tone code and the pseudo-random code approximate the burble generated on FM systems because in either case the interference is modulated by the cosine of a large angle variation. However, the pseudo-random signal alone comes as close as a periodic signal can come to the waveform present on FM systems. Both waveforms suggested above are periodic so that the dispersing spectrum comprises a set of tones. For the case of psuedo-random noise these tones are closely spaced perhaps by as little as 50–100 Hz.

A noise code, as mentioned above, has by far the best subjective effects, as well as avoiding te administrative problems associated with deterministic codes. This type of code must use a receiver of the second type mentioned above, that is, one which identifies the code and uses it to decode the signal. We will then now discuss just such a receiver. To that end, FIG. 5 illustrates an embodiment of the invention wherein, at the transmitting location, the output of the pilot oscillator, $\omega_c$, is added to the baseband signal $w(t)$, prior to modulation thereof in modulator 12. In this embodiment, code generator 17 produces an appropriately band-limited $f(t)$ signal which is not known, a priori, to the decoder; for example, a truly random noise-like signal. Now the tone before coding is: $\cos \omega_c t$, and the tone after coding is: $\cos[\omega_c t + f(t)]$. But this signal is precisely the one needed to perform the decoding operation! Unfortunately, the signal must first be shifted to center on the carrier frequency $\omega_0$. Also, it will have on it the system noise which is added from the point at which coding was performed, assuming the $\omega_c$ tone was blocked and then reinserted at the originating end. Of course, the decoding process itself will add noise which is proportional to the noise present with the $\omega_c$ tone. More specifically, the signal needed to demodulate (i.e., to decode) the coded waveform is $$\cos[\omega_o = f(t)] \qquad (18)$$

where $\omega_o$ is the regenerated carrier. Now if a tone at some convenient frequency $\omega_c$ is added to the message load $w(t)$, as shown in FIG. 5, it will arrive at the decoder as $$\cos[\omega_c t = f(t)]$$

so that only a frequency translation is needed to recover the desired decoding signal. The carrier frequency itself, $\omega_o$, could be used; however, it may not be in a convenient part of the band; and it may be desirable from a systems point of view to separate the decoding function from carrier regeneration. As shown in FIG. 5, a bandpass filter 51 is connected to the output of transmission medium 14 and the characteristics thereof are selected such that only a narrow band of frequencies centered around $\omega_o + \omega_c$ are passed (assuming upper sideband selection). The output of filter 51 is next demodulated in a phase-demodulator 52 to yield $g(t) = f(t)$. This coding signal is then applied to phase-modulator 24 in the normal way. A delay element 53 is inserted between the output of transmission medium 14 and the input to demodulator 21 to compensate for the delay introduced in $f(t)$ by filter 51 and demodulator 52.

Bandpass filter 51 will also give system noise at its output. A simple analysis will be shown to indicate the magnitude of the problem. Thus, the output of demodulator 21, after decoding, will be, taking as a test signal a sinusoid of frequency $\omega_s$, $$\cos[(\omega_s + \omega_o)t + f(t)] \cdot \{\cos[\omega_o t + f(t)] + n(t)\} = \cos \omega_s t \{1 + n(t) \cos[\omega_o t + f(t)]\} \quad (20)$$

where $n(t)$ is system noise band-limited to the effective spectral width of the decoding signal. As was argued above, since the system is linear, we may generalize this result to stochastic or deterministic signals. Since the noise is independent of the signal, the power in the resultant signal is $$p_w \left(1 + \frac{p_n}{2}\right) \quad (21)$$

where $p_w$ and $p_n$ are the powers of the signal and noise, respectively. The signal-to-noise ratio is then essentially $2/p_n.2/p_n$ is numerically equal to the signal-to-noise ratio out of bandpass filter 51. Thus, the use of this embodiment puts at least as much noise on the signal as was present in the band centered around the $\omega_c$ pilot tone. However, if blocking and reinserting of tone $\omega_c$ is used, then this added noise is reduced, since the signal-to-noise would only be that existing between two terminals, less the terminal noise.

Since the decoding signal comprises a large index phase-modulation, phase-demodulation of the signal prior to decoding signal reconstruction will yield a maximum signal-to-noise improvement to 10 log $\pi^2$ or about 10 dB. This improvement, coupled with a modest increase in transmitted tone level, keeps the noise contribution well below system noise.

If desired, a second bandpass filter 57 may be connected to the output of demodulator 21. The output of filter 57 is connected to a phase-demodulator 58, thence to an error detector 59. If the code signal applied to phase-modulator 24 is the correct code, and in synchronism with the code employed at the encoder, the output of amplitude demodulator 21 will include a component which comprises a pure tone of $\omega_c$. Thus, if the bandpass of filter 57 is centered on $\omega_c$, the output of phase-demodulator 58 will comprise an error signal which when applied to an error detector, for example a tuned circuit resonant at $\omega_c$, will develop a voltage proportional to the disagreement between $g(t)$ and $f(t)$.

Figure 6:
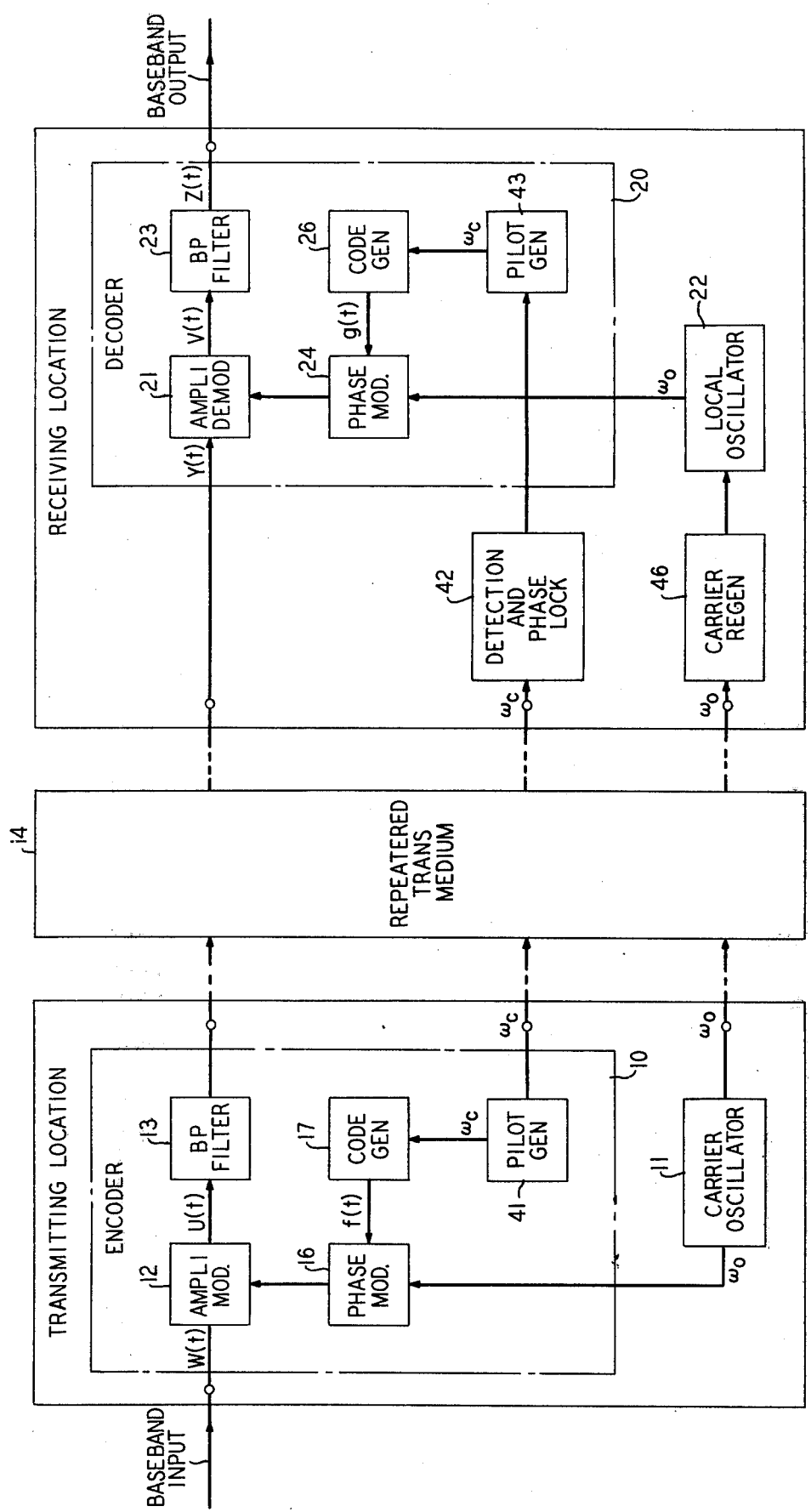
FIG. 6 is a block schematic diagram of a third illustrative embodiment of the invention wherein a pilot coding tone is transmitted from the encoder to the decoder.

Regardless of the coding scheme employed, the decoding operation must be coherent, so synchronization will generally be necessary between the coder and the decoder. Note that in the receiver just discussed (the second type) synchronization is automatic. FIG. 6 is similar to FIG. 1, except that the means needed for synchronizing the coding and carrier are shown. The output of a pilot generator 41, designated $\omega_c$, is applied to the code generator 17 to synchronize the same. If the code comprises a single-tone, the output of generator 41 may itself comprise the coding tone, and, in that event, function generator 17 may be eliminated. If, however, the code comprises pseudo-random noise, the output of pilot generator 41 acts as a clock signal to drive the pseudo-random generator in function generator 17. The output of pilot generator 41 is transmitted over the transmission medium 14 along with the message load. At the receiving location, a detection and phase-lock circuit 42 detects and locks the phase of the received pilot tone and applies it to a pilot generator 43 to synchronize the same. Generator 43, in turn, generates a local pilot tone, also designated $\omega_c$, which is synchronized in frequency and phase with the pilot tone employed at the transmitting location. As previously mentioned, generator 43 includes an automatic gain circuit to maintain the amplitude of $\omega_c$ at a constant level even if the amplitude of the incoming pilot tone from transmission medium 14 should change. This AGC is needed if the code is a tone. If the code is pseudo-random, the AGC is needed on block 26. Of course, it is also necessary to transmit the carrier frequency $\omega_o$ from the encoder to the decoder, via the transmission medium or other circuit. At the receiving location, a carrier regeneration circuit 46 amplifies and filters the received carrier signal, then applies the signal to local oscillator 22 to synchronize the same. In FIG. 6 separate paths are shown for the synchronizing signals $\omega_c$ and $\omega_o$. In practice, these tones are sent along with the coded output of modulator 12. Carrier regeneration is, of course, tightly linked to coding since the phase modulation shown in FIG. 2 must have a carrier. After carrier regeneration has occurred on the carrier frequency $\omega_o$, a separate lock using the pilot signal $\omega_c$ is established for $g(t)$, the phase modulation on the carrier. This separate lock is needed because of delay experienced in transmitting the message load and the pilot tones through repeatered medium 14. It will be apparent that if the code on the signal arriving at the decoder is $f(t-\tau_1)$ but the decoder is using $f(t-\tau_2)$, serious decoding errors will result. Put another way, the coder and decoder are time-varying systems which require synchronization; thus, relative delay between the synchronization signal and the signal to be decoded will have an adverse effect.

Figure 7:
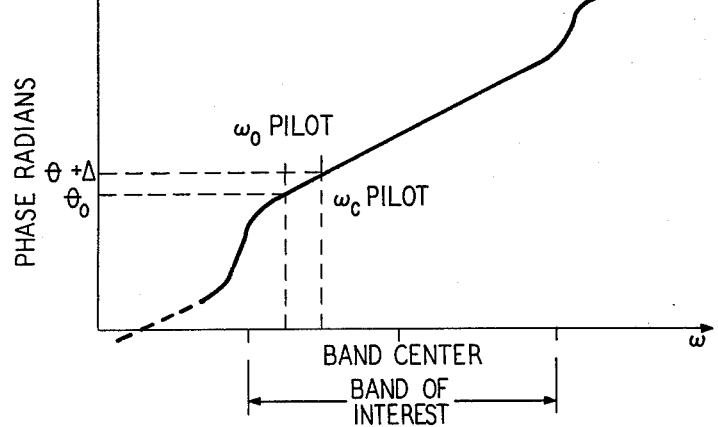
FIG. 7 is a graph depicting the effect of delay in the repeatered transmission medium, as a function of frequency.

At first, it might appear that a lock on the carrier frequency $\omega_o$ alone would be enough to establish the required delay; that this is not so can be seen from FIG. 7 which shows a representative phase characteristic for repeatered medium 14 with illustrative pilot frequency positions superimposed thereon. Even if the carrier pilot $\omega_o$ arrives at the decoder with precisely the same frequency and phase as when transmitted, there are an infinite number of sloped lines that may be drawn through that one point, corresponding to an infinite number of delays. In the conventional situation, with no-coding applied to the transmitted signal, this delay would be of no concern to the average subscriber since it does not distort the received waveform. However, use of a second pilot tone, $\omega_c$, establishes this delay by supplying another phase measurement at a known frequency separation from the carrier pilot. Thus, locking into both pilots assures the proper delay compensation in the decoder.

From a mathematical standpoint, the results of this situation are easily derived and give an insight into the effects of linear distortions in general. Since the modulation signal is so much longer than the anticipated synchronization delay, comparatively large synchronization delays amount to small angular errors, referred to the coding modulation, and so give rise to small errors. Furthermore, the residual modulation due to synchronization errors is of low index and hence negligible beyond the first harmonic. Proceeding analytically, suppose that the output of the repeatered medium $y(t)$, is delayed by $\tau$ seconds relative to the decoder synchronization signal. Then, noting first that $$\frac{f(t) - f(t-\tau)}{\tau} \cong f'(t) \tag{22}$$

$z$ may be written immediately as (again using the $\cos \omega_s t$ test signal with no loss of generality)

$$z(t) = \cos[\omega_s t + \tau f'(t)]. \tag{23}$$

Since $\tau f'(t)$ will have to be small, and if the pure delay on $\cos \omega_s t$ is ignored, then $z(t)$ is a replica of $\cos \omega_s t$ with residual phase modulation. Suppose we have the simple case where $$f(t) = X \cos \omega_c t \tag{24}$$

then the power of the residual modulation, compared to the desired signal, is $$20 \log X\omega_c\tau. \tag{25}$$

Figure 8:
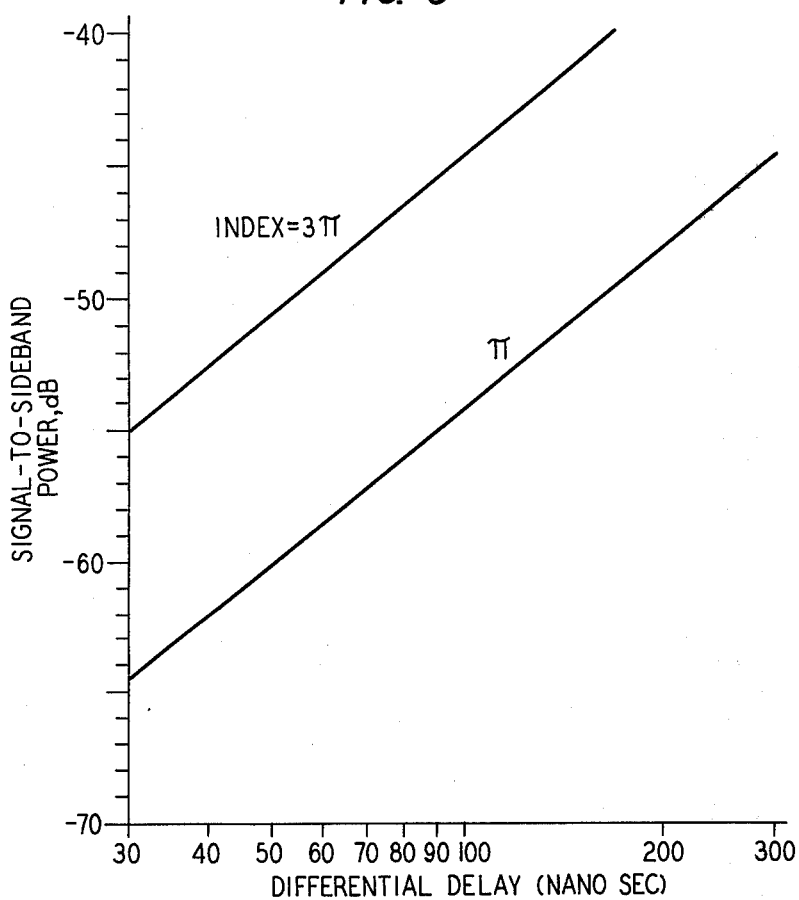
FIG. 8 is a graph depicting the effect of uncompensated channel delay upon distortion.

This situation is depicted in FIG. 8 for a 2 kHz code, that is for $\omega_c = 2\pi \times 2 \times 10^3$.

This analysis can also be used to describe the effects of linear distortions in the medium 14 in a succinct fashion. Non-linear effects will be dealt with afterward.

Suppose the medium 14 has delay distortion. Then the delay is different at different frequencies within the band. Suppose the pilot being used for decoding is at $\omega_c$, and we consider a voice circuit at $\omega_c + \Delta\omega$. If the differential delay at these two frequencies is $\tau$, then the results above for synchronization errors are directly applicable, and FIG. 8 may be used. Suppose the voice circuit at $\omega_c + \Delta\omega$ had a data tone in it. Then for a code of $\pi$ radians index and differential delay of 100 nanoseconds, the data tone will have sidebands of about 54 dB down. If these sidebands fall into adjacent circuits carrying voice, these tones from the phase coding would constitute a serious interference in themselves. Thus, the medium must have low values of delay distortion, and the code index and highest frequency must be chosen for acceptable values of residual interferences. The effects of amplitude distortions are mostly felt in how they distort the code being sent with the synchronization signal, and requirements are not nearly so demanding as for delay distortion.

Let us now consider the effects of non-linear distortion on a narrowband system (even order distortion products not present). Assume that the signal $w(t)$ is a sum of several tones. If each coded tone is $x_i$, then the third-order intermodulation $x^3(t)$ is:

$$x^3(t) = \sum_i \sum_j \sum_k x_i x_j x_k \tag{26}$$

where $$x_i = \cos[(\omega_o + \omega_i)t + f(t)]. \tag{27}$$

Now, if the angle for each $x_i$ is called A, B, and C, respectively, then all inband components have angles A-B+C: or $$x^3(t) = \sum_i \sum_j \sum_k \cos[(\omega_o + \omega_i - \omega_j + \omega_k)t + f(t)]. \tag{28}$$

Accordingly, each intermodulation component is coded in exactly the same manner as is the desired signal. This result will hold for all odd orders of inband intermodulation, by extension of the above argument. Thus, coding has no effect on pertinent intermodulation for a narrow-band system. This result may also be extended to non-linearities with memory.

Let us now briefly consider the problems of residual AM on the phase-modulated carrier and shape distortions on the decoding signal.

If the carrier that is used for the coding process has a residual AM modulation on it of, say $a(t)$, and the decoding carrier likewise has AM modulation on it of, say $b(t)$, then the decoded baseband signal is, in the notation previously used, $$z(t) = a(t) b(t) \cos \omega_s t \tag{29}$$

Both $a(t)$ and $b(t)$ are real and are probably periodic with a frequency $\omega_c$. For an approximation, if only the strongest harmonic is taken $$a(t) \cong 1 + k_1 \cos(n\omega_c t + \phi_1), k_1 \ll 1 \tag{30}$$

$$b(t) \cong 1 + k_2 \cos(m\omega_c t + \phi_2), k_2 \ll 2 \tag{31}$$

Accordingly, the ratio between the power of the desired baseband signal and the power of its spurious AM modulation is very nearly $$10 \log \frac{k_1^2 + k_2^2}{2}, dB \quad n \neq m, \text{ or } \phi_1 - \phi_2 = \frac{l\pi}{2}$$

$l$ an odd integer $$10 \log \left( \frac{k_1^2 + k_2^2}{2} + k_1 k_2 \right), dB \quad n = m.$$

A second case with $k_1 = k_2$ gives $$20 \log k + 3 \text{ dB}.$$

Figure 9:
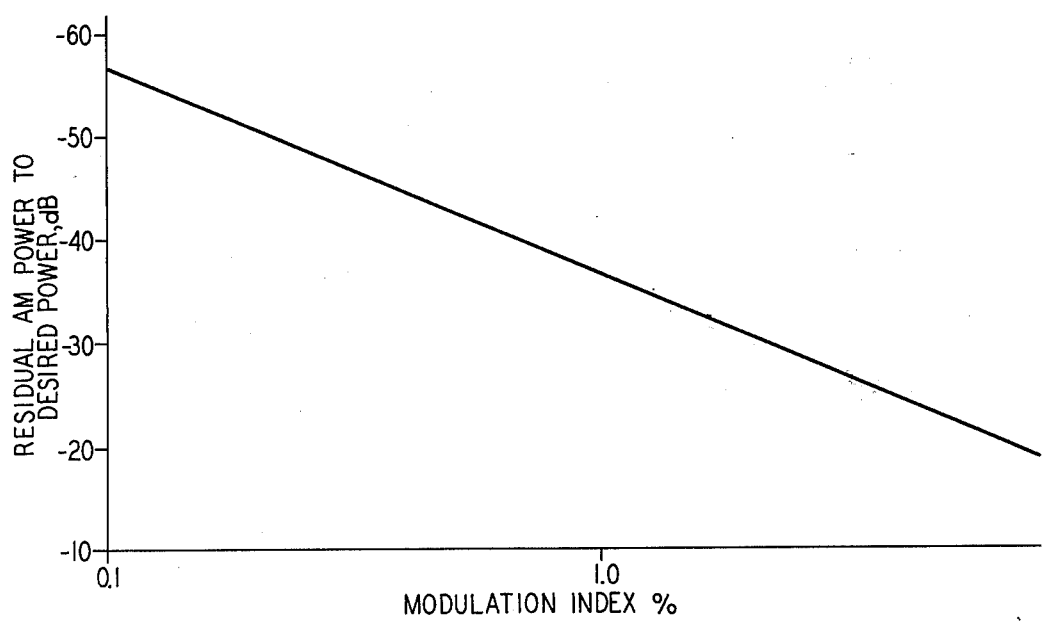
FIG. 9 is a graph depicting the effect of the index of modulation on residual AM distortion.

This situation is plotted in FIG. 9 which shows the ratio of residual AM power to desired power (in dB) as a function of modulation index.

Turning now to shape distortions, if the waveform of $g(t)$ is distorted relative to $f(t)$ (see FIG. 1), the effect is similar to the situation wherein $g(t)$ is delayed relative to $f(t)$. In fact, shape distortions can be treated as a sum of amplitude and phase distortion. As a simple example, if $f(t)$ is a cosine wave, the modulation index might not be identical at the encoder and decoder. This might occur, for example, if the AGC control circuit at the decoder were defective, causing $g(t)$ to have too high or too low a level relative to $f(t)$. Let $$g(t) = (1-\epsilon)f(t). \quad (32)$$

Then the dB error is $$20 \log \frac{\epsilon X}{2}, dB \quad (33)$$

for 50 dB suppression with $X - 2\pi$, then $\epsilon = 0.1$ percent. If the predominant error is amplitude distortion and not waveform distortion, this accuracy might be achieved by the use of an AGC circuit referenced to a voltage standard. The waveform distortion under these circumstances may be analyzed in detail using techniques previously considered.

From the above analysis the largest source of error would seem to be delay distortion. The condition generally used in industry for acceptability of noise is about 30 dBrncO of noise over a 4000-mile system, which works out to about a 42 dB signal-to-noise ratio for 10 terminals. All sources of error in the various embodiments of the invention disclosed herein would appear to fit within these bounds with careful design.

While the invention has been explained with reference to a microwave radio system, one skilled in the art will appreciate that it is not limited and can be applied with equal success to conventional radio transmission systems operating on frequencies substantially lower than those in the microwave range. Indeed, the invention is not even limited to radio systems but could also be used on multiplex carrier systems operating over wire or coaxial cable, bearing in mind that such systems are far less subject to crosstalk.

The various modulators, demodulators, and oscillators which are shown in the drawings are not, per se, considered patentable. No person skilled in the art will disagree with the statement that any suitable device capable of performing the desired function may be employed. For this reason, detailed schematic drawings of the various circuit elements have not been given. However, suitable amplitude modulators and demodulators (i.e., detectors) are shown in *Electronic and Radio Engineering* by Terman, McGraw-Hill, New York, 1955, at pp. 523–544 and pp. 547–566, and *Electronic Principles* by Malvino, McGraw-Hill, New York 1973, at pp. 671–689 and pp. 689–691. Suitable phase modulators and demodulators are shown in Terman at pp. 592–605 and pp. 605–614 and in Malvino at pp. 701–705. Suitable oscillators are shown in Terman at pp. 489–519 and in Malvino at pp. 564–598 and suitable circuits for generating random and pseudorandom, noise-like signals are shown in *Guidebook of Electronic Circuits* by Markus, McGraw-Hill, New York, 1974 at page 568. See also "White Noise Generator" by H. R. Beasbell, *Wireless World*, March 1972, pp. 127–128 and "Sequence Correlator Using Integrated Circuits" by R. G. Young, *Electronic Engineering*, September 1969, pp. 41–45. Power supplies and the detailed interconnection of the various circuit elements have likewise been omitted from the drawings as this is well within the skill of any competent technician.

One skilled in the art will also appreciate that various changes and modifications may be made to the arrangement of parts shown, without departing from the spirit and scope of the invention.

What I claim is:

1. In a transmission system of the type wherein information is transmitted from a first to a second location, said system including, at said first location:
    means for generating a carrier wave; and
    means for modulating the amplitude of said carrier wave with said information, the improvement which comprises:
    means for generating a coding signal; and
    means, positioned intermediate said carrier wave generating means and said amplitude modulating means, for phase-modulating said carrier wave with said coding signal thereby to encode the amplitude-modulated output of said modulating means whereby any interfering signal which enters the transmission system and which is not similarly encoded is spread, in the frequency domain, and thus rendered unintelligible.

2. The apparatus according to claim 1 wherein said coding signal is periodic.

3. The apparatus according to claim 2 wherein said periodic signal is a sinusoid.

4. The apparatus according to claim 2 wherein the product of the index of modulation of said phase modulating means and frequency of said periodic coding signal is no greater than the lowest frequency in said information signal.

5. The apparatus according to claim 4 wherein the frequency of said periodic coding signal is no greater than $1/K$ times the frequency of the lowest frequency component in said information signal, $K \geq 3$.

6. The apparatus according to claim 1 wherein said coding signal is aperiodic.

7. The apparatus according to claim 1 further comprising:
    means for generating a pilot signal to synchronize said coding signal generating means; and
    means for transmitting said pilot signal from said first to said second location.

8. The apparatus according to claim 1 further comprising:
    means for converting the output of said amplitude modulating means into a suppressed carrier, single sideband signal; and
    means for transmitting an attenuated version of said carrier wave from said first to said second location.

9. The apparatus according to claim 1 further comprising:
    means for generating a pilot signal; and
    means for adding said pilot signal to the information signal to be transmitted to said second location, prior to the modulation thereof by said amplitude modulating means.

10. The apparatus according to claim 9 further comprising:
    means for converting the output of said amplitude modulating means into a suppressed carrier, single sideband signal; and
    means for transmitting an attenuated version of said carrier wave from said first to said second location.

11. In a transmission system of the type wherein a coded, amplitude-modulated signal is transmitted from a first to a second location, said system including, at said second location:
  means for generating a local carrier wave; and
  means, connected to said local carrier wave generating means, for demodulating said amplitude-modulated signal, the improvement which comprises:
    means for generating a local coding signal which corresponds to the signal priorly employed at said first location to encode said amplitude-modulated signal; and
    means for phase-modulating said local carrier wave with said local coding signal, thereby to cause said demodulating means to decode said coded amplitude-modulated signal.

12. The apparatus according to claim 11 wherein said local coding signal is periodic.

13. The apparatus according to claim 12 wherein said periodic signal is a sinusoid.

14. The apparatus according to claim 12 wherein said periodic signal is a pseudo-random, noise-like signal.

15. The apparatus according to claim 12 wherein the product of the index of modulation of said phase modulating means and the frequency of said periodic coding signal is no greater than the lowest frequency in said information signal.

16. The apparatus according to claim 12 wherein the frequency of said periodic coding signal is no greater than $1/K$ times the frequency of the lowest frequency component in said information signal, $K \geq 3$.

17. The apparatus according to claim 11 wherein said local coding signal is aperiodic.

18. The apparatus according to claim 17 wherein said aperiodic coding signal comprises a truly random, noise-like signal.

19. The apparatus according to claim 11 wherein a synchronizing pilot signal transmitted from said first location is received at said second location, and said apparatus further comprises:
  means for generating a local pilot signal to synchronize said local coding signal generating means with said coded, amplitude-modulated signal; and
  means, responsive to said received pilot signal, for synchronizing said local pilot signal generating means with said received pilot signal.

20. The apparatus according to claim 11 wherein said coded, amplitude-modulated signal is a suppressed-carrier, single-sideband, coded signal and an attenuated version of said carrier wave is transmitted from said first to said second location, the apparatus further comprising:
  means, receiving the attenuated carrier wave transmitted from said first location, for synchronizing said local carrier wave generating means with said suppressed-carrier, single-sideband signal; and
  means connected to the output of said amplitude demodulating means, for filtering from said output all but the information content of said single-sideband signal.

21. The apparatus according to claim 11 wherein a pilot tone having a frequency $f_c$, where $f_c$ falls below the lowest frequency component in the information signal to be transmitted from said first to said second location, is added to the information signal at said first location, prior to the amplitude modulation thereof, said local coding signal generating means further comprising:
  means, receiving the amplitude-modulated signal transmitted from said first location, for blocking all but a narrow band of frequencies centered about $f_c$; and
  means for phase-demodulating the output from said blocking means, thereby to derive said local coding signal, said apparatus further comprising:
  means for delaying said amplitude-modulated signal, prior to the demodulation thereof in said amplitude-demodulating means, said delaying means introducing a delay which compensates for the delay introduced in the narrow band of frequencies centered about $f_c$ by said blocking and said phase-demodulating means.

22. The apparatus according to claim 21 wherein said coded, amplitude-modulated signal is a suppressed-carrier, single-sideband, coded signal and an attenuated version of said carrier wave is transmitted from said first to said second location, the apparatus further comprising:
  means, receiving the carrier wave transmitted from said first location, for synchronizing said local carrier wave generating means with said suppressed-carrier, single-sideband signal; and
  means, connected to the output of said amplitude-demodulating means, for filtering from said output all but the information content of said single-sideband signal.

23. The apparatus according to claim 22 further comprising:
  means, connected between the output of said amplitude-demodulating means and said filtering means, for blocking all but the narrow band of frequencies centered around $f_c$; and
  an error detector tuned to respond to the frequency $f_c$, connected to the output of said blocking means.

24. In a method fo transmitting information from a first to a second location of the type that includes the steps of:
  generating a carrier wave; and
  modulating the amplitude of said carrier wave with the information to be transmitted, the improvement which comprises the steps of:
  generating a coding signal; and then,
  phase-modulating said carrier wave with said coding signal prior to modulating the amplitude thereof with the information signal.

25. The method according to claim 24 wherein said coding signal is a periodic coding signal.

26. The method according to claim 25 wherein said periodic signal is a sinusoid.

27. The method according to claim 25 wherein said periodic signal is a pseudo-random, noise-like signal.

28. The method according to claim 25 wherein the product of the index of modulation of said modulating step and the frequency of said periodic coding signal is no greater than the lowest frequency component in said information signal.

29. The method according to claim 28 wherein the frequency of said periodic coding signal is no greater than $1/K$ times the frequency of the lowest frequency component in said information signal, where K is $\geq 3$.

30. The method according to claim 24 wherein said coding signal is an aperiodic coding signal.

31. The method according to claim 30 wherein said aperiodic coding signal is a truly random, noise-like signal.

32. The method according to claim 24 including the further steps of:
generating a pilot signal;
synchronizing said coding signal with said pilot signal; and then,
transmitting said pilot signal to said second location.

33. The method according to claim 24 including the further steps of:
suppressing the carrier and one sideband of said modulated carrier wave, thereby providing a suppressed-carrier, single-sideband signal; and
transmitting an attenuated version of said carrier wave to said second location.

34. The method according to claim 24 comprising the further steps of:
generating a pilot signal; and then,
adding said pilot signal to the information signal to be transmitted to said second location, prior to said amplitude-modulating step.

35. The method according to claim 34 including the further steps of:
suppressing the carrier and one sideband of the amplitude-modulated carrier wave thereby to generate a suppressed-carrier, single-sideband signal; and
transmitting an attenuated version of said carrier wave to said second location.

36. In a method of transmitting information in the form of a coded, amplitude-modulated signal from a first to a second location of the type that includes the steps of, at said second location:
generating a local carrier wave; and
demodulating said amplitude-modulated signal by use of said local carrier wave, the improvement which comprises the steps of:
generating a local coding signal which corresponds to the signal priorly employed at said first location to encode said amplitude-modulated signal; and then
phase-modulating said local carrier wave with said local coding signal thereby to ensure proper demodulation of said coded, amplitude-modulated signal.

37. The method according to claim 36 wherein said local coding signal is periodic.

38. The method according to claim 37 wherein said periodic signal is a sinusoid.

39. The method according to claim 37 wherein said periodic signal is a pseudo-random, noise-like signal.

40. The method according to claim 37 wherein the frequency of said periodic coding signal is no greater than the lowest frequency component in said amplitude modulated signal.

41. The method according to claim 37 wherein the frequency of said periodic coding signal is no greater than $1/K$ times the frequency of the lowest frequency component in said information signal, where K is $\geq 3$.

42. The method according to claim 37 wherein said local coding signal is aperiodic.

43. The method according to claim 42 wherein said aperiodic coding signal comprises a truly random, noise-like signal.

44. The method according to claim 36 wherein a synchronizing pilot signal transmitting from said first location is received at said second location, said method comprising the further steps of:
generating a local pilot signal to synchronize the generation of said local coding signal with said amplitude-modulated signal; and
synchronizing the generation of said local pilot signal with said synchronizing pilot signal.

45. The method according to claim 36 wherein said coded, amplitude-modulated signal is a suppressed-carrier, single-sideband, coded signal and an attenuated version of said carrier wave is transmitted from said first to said second location, the method including the further steps of:
detecting the carrier wave transmitted from said first location,
synchronizing the generation of said local carrier wave with the suppressed-carrier, single-sideband signal; by use of said detected carrier wave, and
filtering from the demodulated information signal all but the information content of said single-sideband signal.

46. The method according to claim 36 wherein a pilot tone having a frequency $f_c$, where $f_c$ falls below the lowest frequency component in the information signal to be transmitted from the first to the second location, is added to the information signal at said first location prior to the amplitude modulation thereof, said method comprising the further steps of:
blocking all but a narrow band of frequency centered about $f_c$ from the received amplitude-modulated signal;
phase-demodulating the remaining unblocked portion of said amplitude-modulated signal thereby to generate said local coding signal; and
delaying said amplitude-modulated signal, prior to the demodulation thereof, said delay corresponding to the delay introduced in the band of frequency centered about $f_c$ by said blocking and phase demodulating steps.

* * * * *

UNITED STATES PATENT AND TRADEMARK OFFICE
CERTIFICATE OF CORRECTION

PATENT NO. : 4,019,140

DATED : April 19, 1977

INVENTOR(S) : Richard B. Swerdlow

It is certified that error appears in the above-identified patent and that said Letters Patent are hereby corrected as shown below:

Column 1, line 39, "interfacing" should read --interfering--.
Column 10, line 42, "te" should read --the--. Column 13,
line 11, "into" should read --onto--; line 16, "signal" should
read --period--. Column 14, line 55, "n m" should read
--n $\neq$ m--. Column 18, line 37, "fo" should read --of--.

*Signed and Sealed this*

*Thirteenth* Day of *February 1979*

[SEAL]

Attest:

RUTH C. MASON
*Attesting Officer*

DONALD W. BANNER
*Commissioner of Patents and Trademarks*